United States Patent
Yang et al.

(10) Patent No.: US 12,068,284 B2
(45) Date of Patent: Aug. 20, 2024

(54) VERTICAL INTERCONNECT STRUCTURES WITH INTEGRATED CIRCUITS

(71) Applicant: Taiwan Semiconductor Manufacturing Company, Ltd., Hsinchu (TW)

(72) Inventors: Tzu-Hsien Yang, Hsinchu (TW); Hiroki Noguchi, Hsinchu (TW); Mahmut Sinangil, Campbell, CA (US); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 225 days.

(21) Appl. No.: 17/537,026

(22) Filed: Nov. 29, 2021

(65) Prior Publication Data

US 2022/0302088 A1  Sep. 22, 2022

Related U.S. Application Data

(60) Provisional application No. 63/164,019, filed on Mar. 22, 2021.

(51) Int. Cl.
*H01L 25/18* (2023.01)
*H01L 25/065* (2023.01)
*H01L 21/768* (2006.01)

(52) U.S. Cl.
CPC .......... *H01L 25/0657* (2013.01); *H01L 25/18* (2013.01); *H01L 21/76898* (2013.01); *H01L 2225/06544* (2013.01)

(58) Field of Classification Search
CPC ........................... H01L 25/0657; H01L 25/18
See application file for complete search history.

(56) References Cited

U.S. PATENT DOCUMENTS

| | | | |
|---|---|---|---|
| 11,380,979 B2* | 7/2022 | Dalmia | H01L 23/58 |
| 11,798,914 B2* | 10/2023 | Liu | H01L 25/50 |
| 2015/0249053 A1 | 9/2015 | Or-Bach et al. | |
| 2019/0123188 A1 | 4/2019 | Or-Bach | |
| 2022/0165707 A1* | 5/2022 | Song | H01L 25/18 |

FOREIGN PATENT DOCUMENTS

| | | |
|---|---|---|
| TW | 202109345 A | 3/2021 |
| TW | 202109809 A | 3/2021 |

* cited by examiner

*Primary Examiner* — Thao P Le
(74) *Attorney, Agent, or Firm* — MERCHANT & GOULD P.C.

(57) ABSTRACT

A 3D IC structure includes multiple dies, such as a top die and a bottom die. The top die and/or the bottom die can each include devices such as computing units, Analog-to-Digital converters, analog circuits, RF circuits, logic circuits, sensors, Input/Output devices, and/or memory devices. One or more vertical interconnect structure (VIS) cells are formed adjacent one or more sides of the device. A VIS is formed in some or all of the VIS cells. One or more non-sensitive circuits, such as repeaters, diodes, and/or passive circuits (e.g., resistors, inductors, capacitors, transformers), are disposed in at least one VIS cell.

20 Claims, 16 Drawing Sheets

VERTICAL INTERCONNECT STRUCTURES WITH INTEGRATED CIRCUITS

PRIORITY CLAIM AND CROSS-REFERENCE

The present application claims the benefit of U.S. Provisional Patent Application No. 63/164,019 titled "Through-Silicon Vias with Integrated Components" and filed on Mar. 22, 2021, of which the entire disclosure is hereby incorporated by reference in its entirety.

BACKGROUND

Three-dimensional (3D) stacked chips or integrated circuits (IC) are an integration technology that can be used in modern computing and electronic systems. Through-silicon vias (TSVs) are used to electrically connect two or more stacked dies. For example, a TSV can enable a heterogeneous integration of a computation die and a memory die to reduce the footprint of the stacked dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
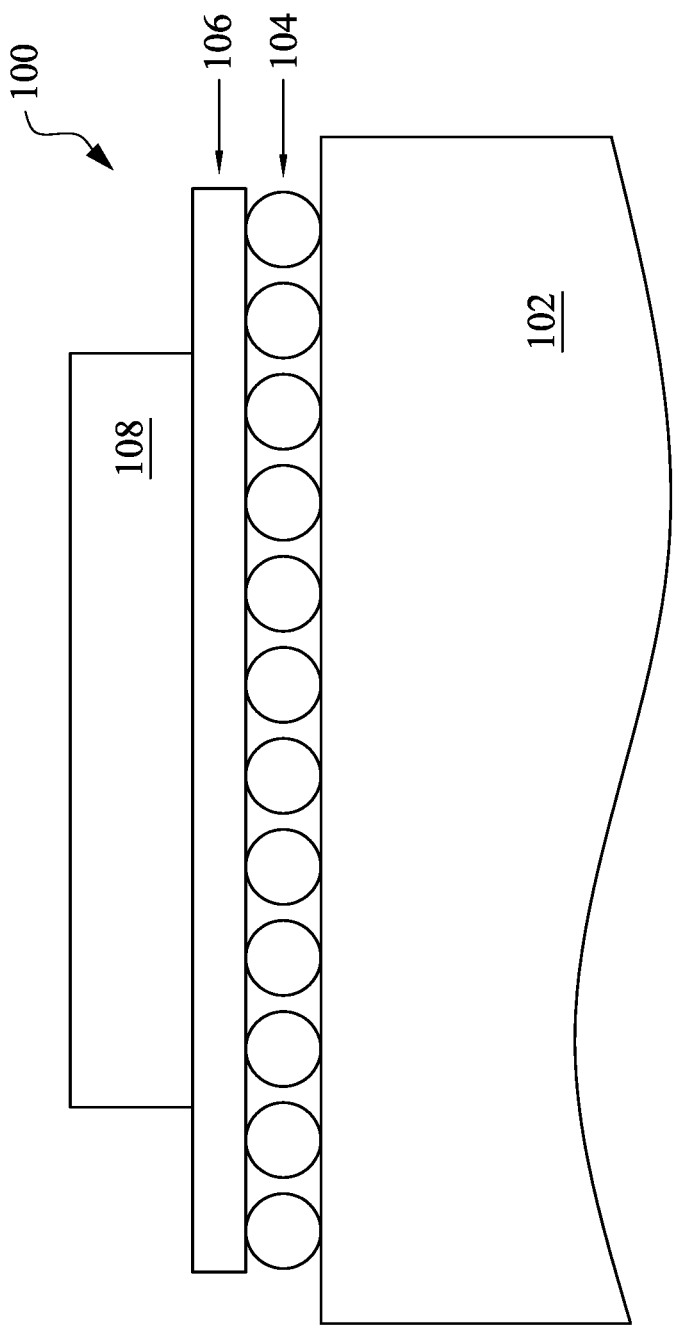
FIG. 1 illustrates a 3D IC package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein provide 3D IC structures that include multiple die layers, such as a top die layer and a bottom die layer. The top die layer and/or the bottom die layer includes devices such as computing units, Analog-to-Digital converters (ADCs), analog circuits, RF circuits, logic circuits, sensors, Input/Output (I/O) devices, and/or memory devices. Example memory devices include Static Random Access Memory (SRAM), Resistive Random Access Memory (RRAM), Dynamic Random Access Memory (DRAM), cache, and/or Flash Memory. Example computing units are microprocessors, field-programmable gate arrays, graphics processing unit, and the like.

A layout of vertical interconnect structures (VIS) is formed in the die layers of a 3D IC structure. The VIS can be any suitable type of vertical interconnect structures, such as through-silicon vias (TSVs), through-glass vias (TGVs), and through-dielectric vias (TDVs). The VIS can be used to transmit power signals, data signals, and bias voltage signals (e.g., analog bias signals). Non-sensitive circuits, such as, repeaters, diodes, inverters, passive components (e.g., resistors, inductors, capacitors, transformers), logic circuits, and electrical components that form circuit paths, can be placed in one or more unused die areas in the VIS cells in each die layer, where a VIS cell includes a VIS and unused die area. Thus, the non-sensitive circuits are integrated with the devices on the one or more die layers in the 3D IC. In such embodiments, the unused die area in the VIS cells can be reduced. Additionally or alternatively, the area utilization of the die can be improved.

A non-sensitive circuit is a circuit whose operations are not significantly impacted by the operation of the VISs, the devices, and/or the 3D IC. For example, potential adverse effects such as electromagnetic interference, heat, and capacitive coupling can degrade the performance of some types of circuits ("sensitive circuits"), such as a transistor. This degraded performance may also adversely impact the operation of a device that is operably connected to the sensitive circuit and/or degrade the operation of the 3D IC.

The performance of a non-sensitive circuit is not significantly affected by the potential adverse effects, or if affected, does not significantly impact the operation of a device or the 3D IC. In some embodiments, a sensitive circuit can be positioned in a VIS cell when a non-sensitive circuit is disposed between the VIS and the sensitive circuit. The non-sensitive circuit buffers the sensitive circuit from any adverse effects.

FIG. 1 illustrates a 3D IC package in accordance with some embodiments. The 3D IC package 100 includes a substrate 102. The substrate 102 may be any suitable type of substrate, such as a silicon-based substrate or a printed circuit board. Electrical connectors 104 are disposed between the substrate 102 and an interposer 106. In the illustrated embodiment, the electrical connectors 104 are solder bumps, but other embodiments are not limited to this implementation. The electrical connectors 104 can be any suitable electrical connector, such as wire bonds or a ball grid array.

The electrical connectors 104 transmit power signals, data signals, and/or bias signals between the substrate 102 and the interposer 106. The interposer 106 is configured to route the signals between the electrical connectors 104 and the 3D IC 108. The 3D IC 108 includes two or more die layers stacked vertically and one or more VISs in each die layer to electrically connect the die layers to each other. In some embodiments, the 3D IC 108 is a heterogeneous 3D IC where the types of devices on one die layer differ from the types of devices on another die layer. For example, the types of devices on a bottom die layer can be memory devices and the types of devices on a top die layer may be computing units. In other embodiments, the 3D IC 108 is a homogeneous 3D IC where the same type of devices is formed in and/or on the die layers.

As will be described in more detail later, the VISs in one die layer in the 3D IC 108 are arranged in a layout that differs from the layout of the VISs in another die layer. The different layouts can vary to meet improved or optimum area usage and/or routing requirements. For example, an electronic design application (EDA) can be used to determine the best or optimum layout for the VISs in a die layer based on the power requirements of the devices on that die layer as well as the power requirements of the devices on any die layers disposed above the die layer.

Additionally or alternatively, the diameter, the pitch, and the density of the VISs are the same on one die layer but the diameter, the pitch, and/or the density of the VISs can differ on another die layer. The VIS layout, the diameter, the pitch, and the density of the VIS in each die layer are based on, for example, the power requirements of the devices on a die layer, the power requirements of the devices on an upper die layer(s), and/or the IR drop experienced by the power signals, data signals, and/or analog bias signals at the upper die layer(s). For example, when a 3D IC is formed with two die layers, the layout of the VISs in the bottom die layer is based on the power requirements of the devices on the bottom die layer, the power requirements of the devices on the top die layer, and/or the IR drop experienced by the power signals, data signals, and/or analog bias signals at the top die layer. The layout of the VISs in the top die layer is based on the power requirements of the devices on the top die layer. When the power signals are input into the 3D IC at the bottom die layer, the density of the VISs in the bottom die layer is typically greater than the density of the VISs in the top die layer because the VISs in the bottom die layer have to provide a sufficient or minimum amount of power to the devices on the top die layer to maintain the integrity of the operations of the devices on the top die layer.

Figure 2:
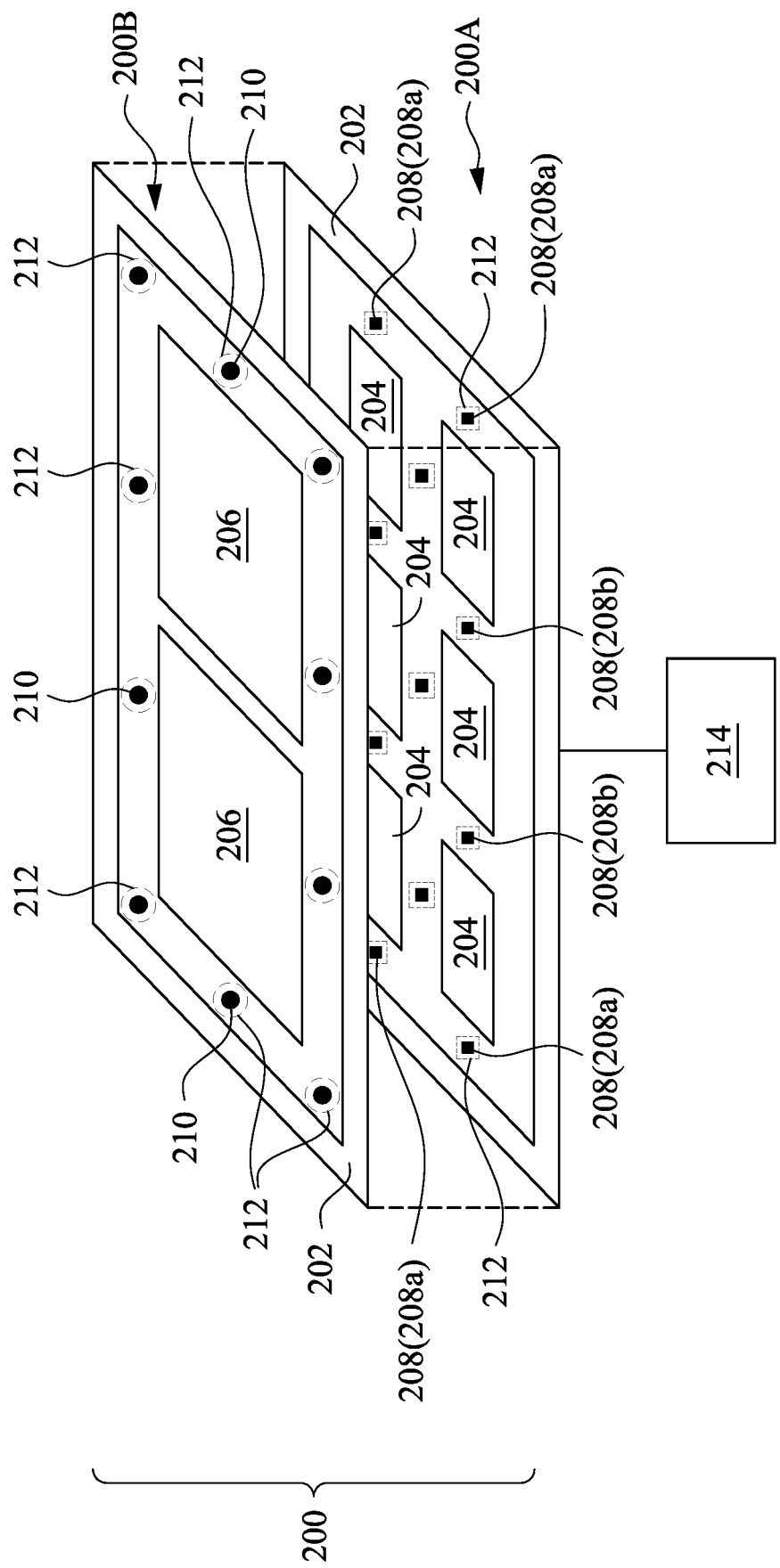
FIG. 2 illustrates an example 3D IC structure in accordance with some embodiments.

FIG. 2 depicts an example 3D IC structure in accordance with some embodiments. The 3D IC structure 200 includes multiple die layers. For illustration purposes, FIG. 2 includes selected portions of a 3D IC structure. Other portions that are not shown may be included in a 3D IC structure. For example, micro-bumps, molding regions, dummy regions, adhesion layers, a heat sink, interconnects, ball grid array (BGA) connectors, silicon interposers, and other components or structural elements may be included.

In the illustrated embodiment, the 3D IC structure 200 includes a die layer 200A and a die layer 200B disposed over the die layer 200A. Other embodiments of a 3D IC structure can include additional die layers (e.g., 3, 5, or 8 layers). In some embodiments, peripheral structures 202 can provide mechanical support and/or provide thermal conduction for heat dissipation.

The die layer 200A includes devices 204. Example devices 204 include, but are not limited to, memory devices and I/O devices. The die layer 200B includes devices 206. The devices 206 on the die layer 200B may be the same type of devices or a variety of different devices. In a non-limiting embodiment, the devices 206 are computing units. In other embodiments, when the 3D IC structure is a heterogenous 3D IC structure, the die layer 200A can include one or more computing units and the die layer 200B may include RF and analog circuits. In another example embodiment of a heterogeneous 3D IC, the die layer 200A can include logic circuits and memory devices, and the die layer 200B may include sensors, input/output (I/O) devices, and one or more computing units.

The die layer 200B is electrically connected to the die layer 200A through the VISs 208 on the die layer 200A and the VISs 210 on the die layer 200B. One or more devices 204 are electrically connected to one or more respective devices 206 through the VISs 208, 210. As discussed earlier, the VISs 208, 210 include TSVs, TDVs, or other types of vertical interconnect structures. In the illustrated embodiment, the VISs 208, 210 are TSVs. The TSVs can be power TSVs, data signal TSVs, and bias TSVs. For example, the VISs 208a positioned around the periphery of the bottom die layer 200A may be data signal TSVs and the VISs 208b disposed between the devices 204 can be power TSVs.

The VISs 208 in the die layer 200A are arranged in a first layout, while the VISs 210 on the die layer 200B are arranged in a different second layout. As described earlier, the layout of the VISs 208 on the die layer 200A is based at least on factors such as the power requirements of the devices 204 on the die layer 200A, the power requirements of the devices 206 on the die layer 200B, and/or the IR drop experienced by the power signals, data signals, and/or analog bias signals. The layout of the VISs 210 on the die layer 200B is at least based on the power requirements of the devices 206 on the die layer 200B. In some instances, the layouts of the VISs 208, 210 can also be based on an improved or optimized consumption of the die area on the die layers 200A, 200B.

Disposed between the VISs 208, 210, around the VISs 208, 210, and/or adjacent to the VISs are unused die areas 212 (represented by dashed lines). As will be described in more detail later, non-sensitive circuits can be formed in one or more unused die areas 212 on the die layer 200A and/or on the die layer 200B and electrically connected to a respective device or devices 204, 206 on that die layer 200A, 200B. In some embodiments, a sensitive circuit can be positioned in the unused die area 212 when a non-sensitive circuit is disposed between the VIS and the sensitive circuit to buffer the sensitive circuit from any adverse effects, such as electromagnetic interference, heat, and/or capacitive coupling.

In the illustrated embodiment, a power supply 214 is electrically connected to the bottom die layer 200A through electrical connectors, such as the electrical connectors 104 shown in FIG. 1. The power supply 214 can provide power to the devices 204, 206 on the die layers 200A, 200B. The power is supplied to the die layers 200A, 200B through at least some of the VISs 208, 210.

Figure 3:
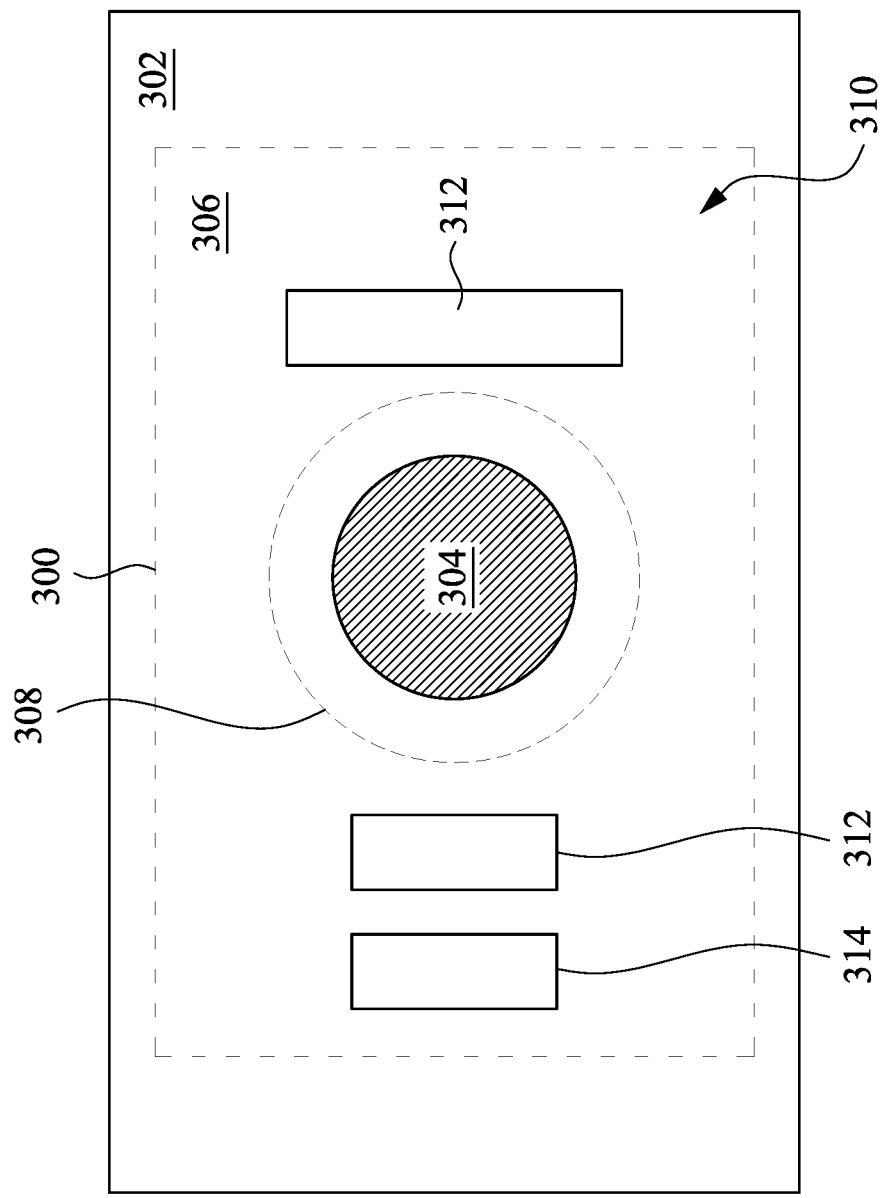
FIG. 3 illustrates a top view of a vertical interconnect structure cell on a die layer in accordance with some embodiments.

FIG. 3 illustrates a top view of a VIS cell on a die layer in accordance with some embodiments. The VIS cell 300 is an area on a die layer 302 that includes a VIS 304 and an area of unused die area 306 around the VIS 304. Although the VIS cell 300 is shown as having a rectangular shape and the VIS 304 as having a circular shape, other embodiments are not limited to these configurations. A VIS cell 300 and a VIS 304 can have any suitable shape.

In some embodiments, the unused die area 306 is divided into two sections, a first section 308 that is immediately adjacent and around the VIS 304 and a second section 310 that is immediately adjacent and around the first section 308. Generally, sensitive and non-sensitive circuits are not formed in the first section 308 due to the proximity to the VIS and the potential for interfering with the operation of the VIS (e.g., a short circuit).

In one embodiment, one or more non-sensitive circuits 312 are formed in the second section 310. Example non-sensitive circuits include, but are not limited to, resistors, inductors, capacitors, transformers, and diodes. Additionally or alternatively, one or more sensitive circuits 314 are disposed in the second section 310 with at least one non-sensitive circuit 312 formed between the sensitive circuit 314 and the VIS 304.

Figure 4:
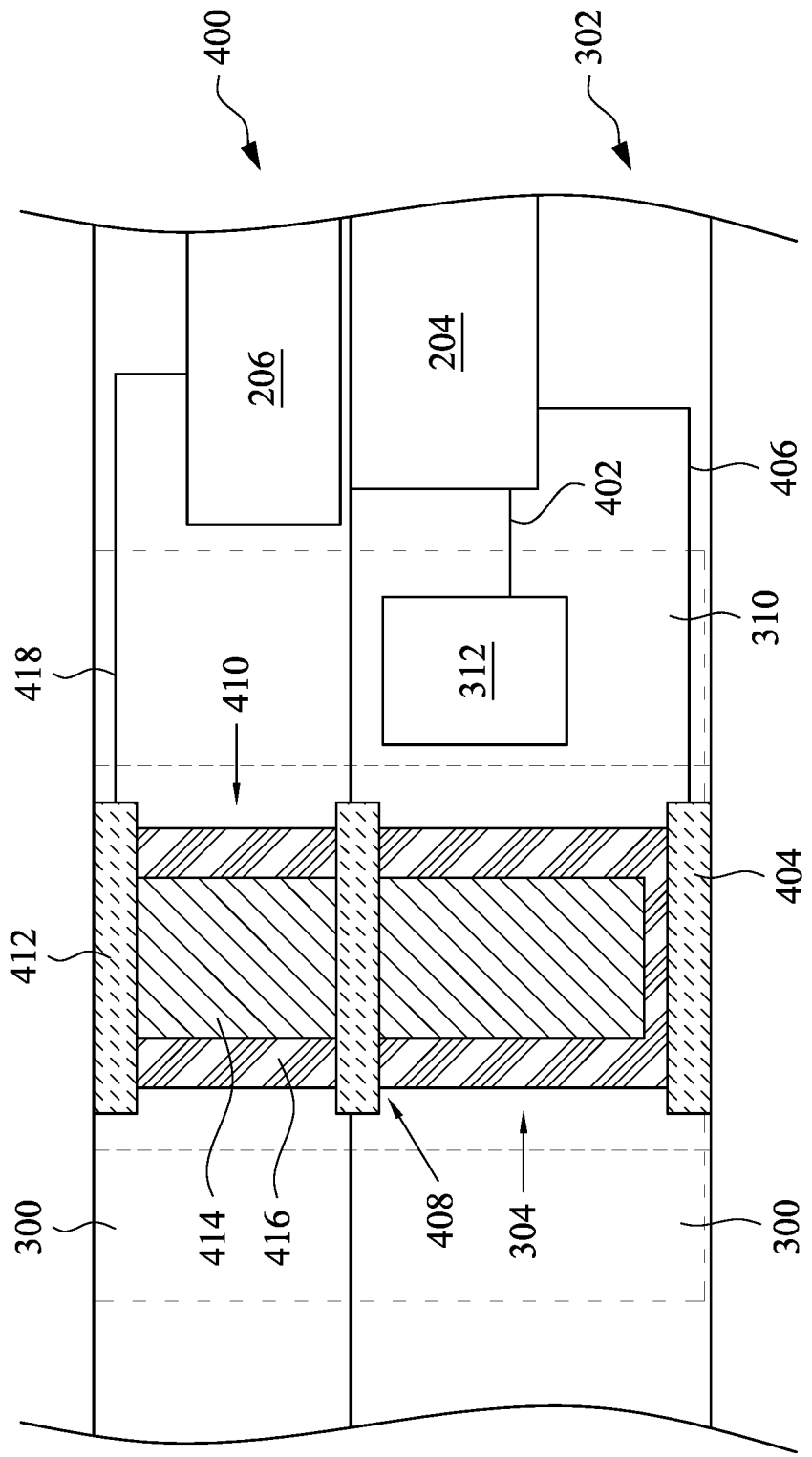
FIG. 4 illustrates a cross-sectional view of a 3D IC structure that includes the die layer shown in FIG. 3 in accordance with some embodiments.

The die layer 302 in FIG. 3 can be a top die layer, an intermediate die layer, or a bottom die layer in a 3D IC. FIG. 4 illustrates a cross-sectional view of a 3D IC structure that also depicts a portion of the die layer shown in FIG. 3 in accordance with some embodiments. In FIG. 4, a die layer 400 is positioned over the die layer 302. The die layer 302 includes the VIS cell 300 with the VIS 304 and the non-sensitive circuit 312 disposed in the VIS cell 300. A device 204 is disposed outside the VIS cell 300, and the non-sensitive circuit 312 is electrically connected to the device 204 by the signal line 402. In the illustrated embodiment, the device 204 in the die layer 302 is operably connected to the VIS 304 via the contact 404 and the signal line 406.

An intermediate conductive layer (e.g., a redistribution layer) is disposed between the die layer 302 and the die layer 400. The intermediate conductive layer is patterned to produce the contact 408. A VIS 410 is formed in the die layer 400 and is electrically connected to the contact 408 and the contact 412. Thus, the VIS 304 is electrically connected to the VIS 410 through the contact 408. The VIS 304 and the VIS 410 each includes a conductive material 414 surrounded by an insulating material 416 to electrically isolate the conductive material 414.

The die layer 400 includes the VIS 410 formed in a VIS cell 300 and a device 206 positioned outside the VIS cell 300. In the illustrated embodiment, the device 206 in the die layer 400 is electrically connected to the contact 412 via signal line 418. Thus, the device 204 in the die layer 302 is electrically connected to the device 206 in the die layer 400 through the VISs 304, 410. In other embodiments, the device 204 and the device 206 are not electrically connected to each other, and/or the device 204, the device 206, or both of the devices 204, 206 are not electrically connected to the VIS 304, 410. Additionally or alternatively, one or more non-sensitive circuits, and/or one or more sensitive circuits 314 and non-sensitive circuits 312, may be positioned in the unused die area in the die layer 400.

Figure 5:
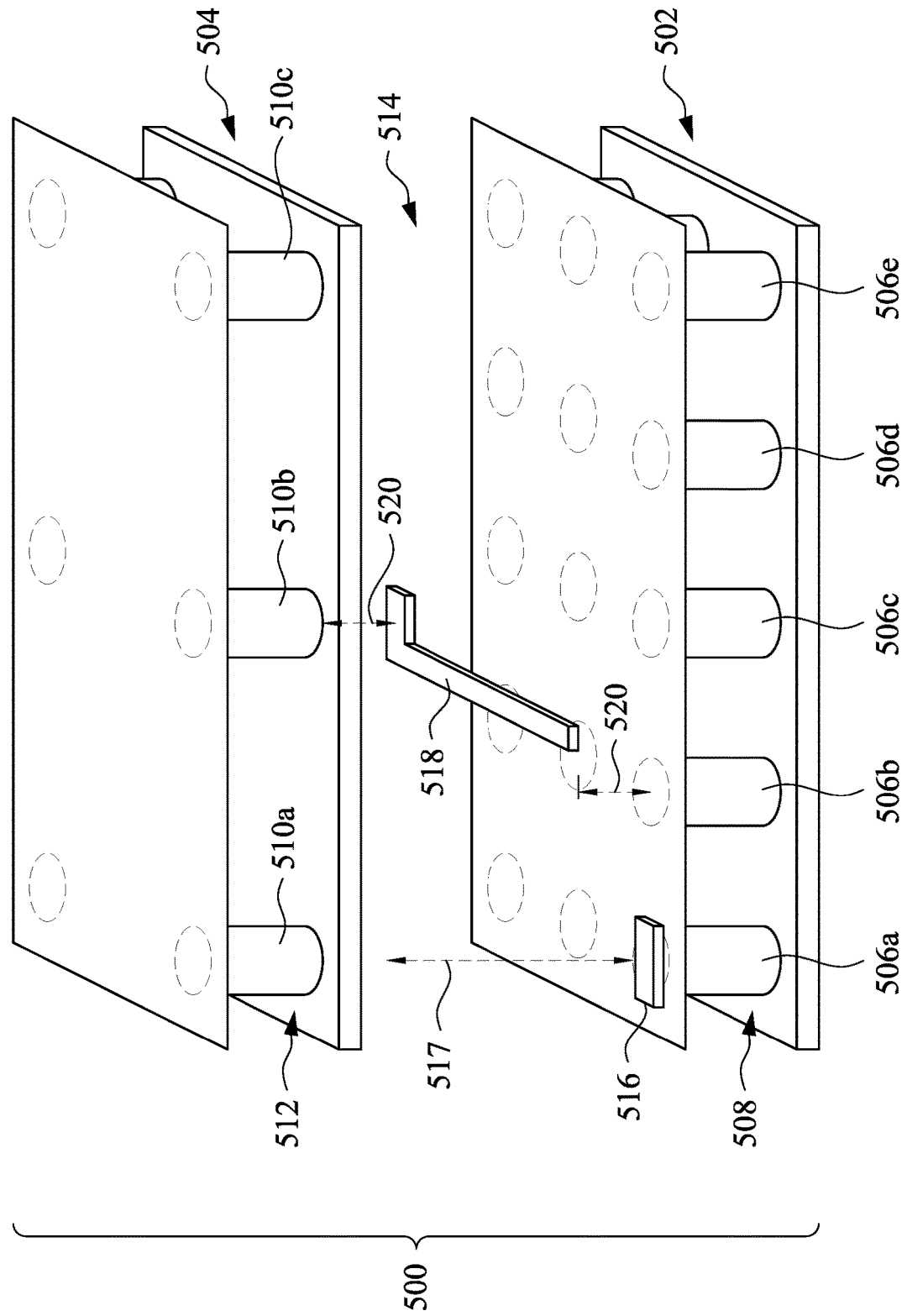
FIG. 5 illustrates connections between vertical interconnect structures on different dies in the 3D IC in accordance with some embodiments.

FIG. 5 illustrates connections between vertical interconnect structures on different dies in a 3D IC in accordance with some embodiments. The 3D IC 500 includes a die layer 502 positioned under a die layer 504. The VISs 506a-506e on the die layer 502 are arranged in a first layout 508. The VISs 510a-510c on the die layer 504 are arranged in a second layout 512. As discussed earlier, the layouts 508, 512 can differ based on improved die area consumption and/or the power requirements of the die layers 502, 504.

Positioned between the die layers 502, 504 is an intermediate conductive layer 514 (e.g., a redistribution layer). The electrical connections between the die layers 502, 504 are implemented through the intermediate conductive layer 514. The intermediate conductive layer 514 is patterned to produce one or more contacts (collectively contact 516) and one or more signal lines (collectively signal line 518). The contact 516 is used to electrically connect a VIS in the die layer 502 (e.g., VIS 506a) to a VIS in the die layer 504 (e.g., VIS 510a). The electrical connection between the VIS 506a and the VIS 510a is represented by the dashed line 517.

Since the second layout 512 of the VISs 510a-510c on the die layer 504 differs from the first layout 508 of the VISs 506a-506e on the die layer 502, the signal line 518 is used to route a signal from a VIS in one die layer to a respective VIS in another die layer. For example, as shown in FIG. 5, the signal line 518 electrically connects the VIS 506b on the die layer 502 to the VIS 510b on the die layer 504. The electrical connection between the VIS 506b and the VIS 510b is represented by the dashed line 520.

Although only one contact 516 and only one signal line 518 are shown in FIG. 5, other embodiments can include any suitable number of contacts and signal lines in the intermediate conductive layer 514. Additionally, although not shown in FIG. 5, an insulating material is disposed around the contact 516 and the signal line 518 to electrically isolate the contact 516 and the signal line 518 from each other and from other contacts and/or signal lines in the intermediate conductive layer 514.

Figure 6:
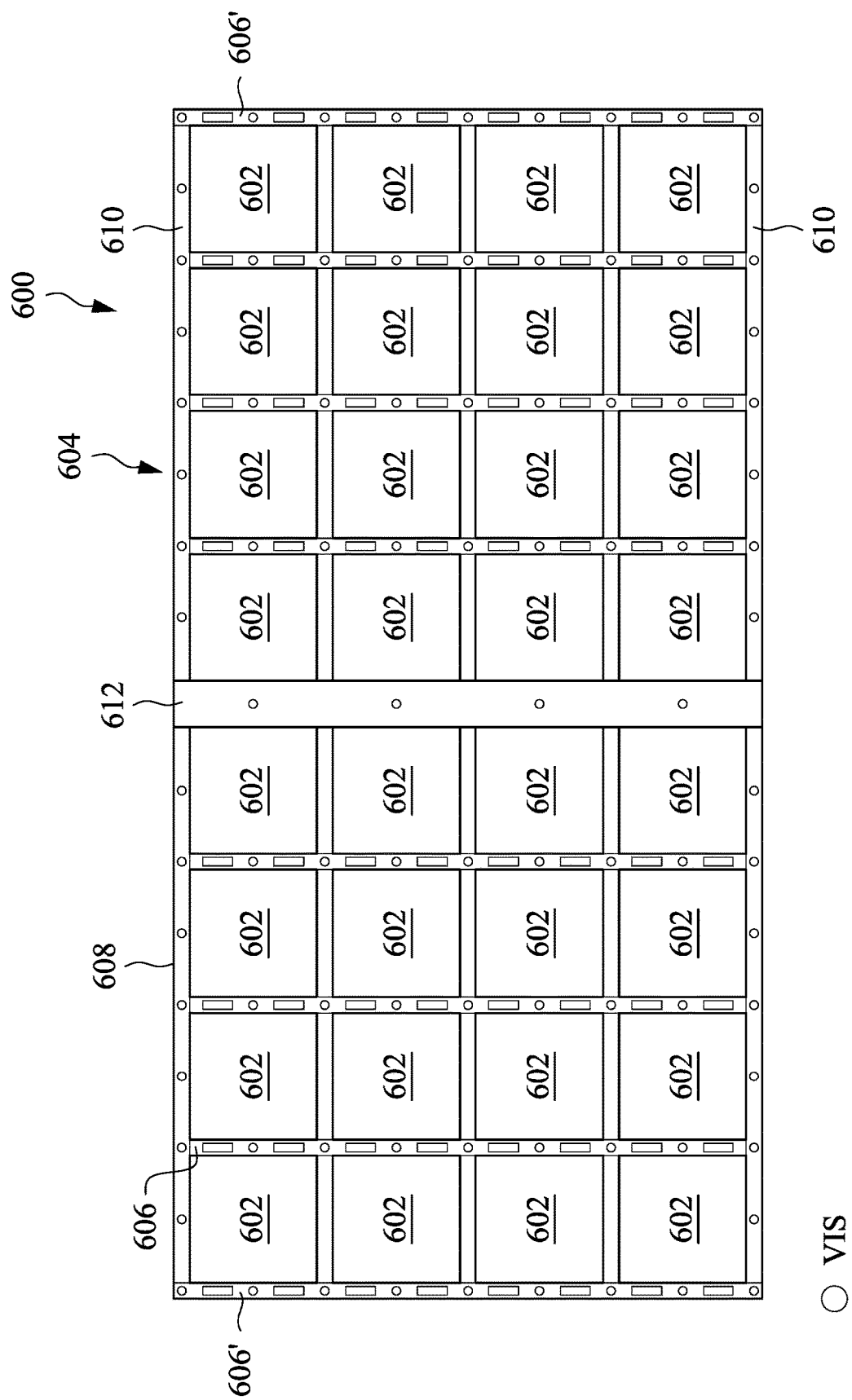
FIG. 6 illustrates a block diagram of a first example of a die layer in accordance with some embodiments.

FIG. 6 depicts a block diagram of a first example of a die layer in accordance with some embodiments. In a non-limiting example, the die layer 600 is the die layer 200A in FIG. 2. Multiple devices 602 are disposed within or on the die layer 600. As discussed earlier, example devices 602 include, but are not limited to, SRAM, RRAM, DRAM, and Flash memory devices, ADCs, I/O devices, and/or computing units.

In FIG. 6, the devices 602 can be the same type of devices (e.g., memory) or at least one type of device 602 (e.g., memory) may differ from another type of device 602 (e.g., logic circuit). In the example embodiment, a grid 604 of VISs is formed in the die layer 600 such that each device 602 is laterally surrounded by VISs. FIG. 6 depicts first lines 606 of VISs (e.g., vertical or perpendicular lines with respect to the edge 608) and second lines 610 of VISs (e.g., horizontal or parallel lines with respect to the edge 608), and a center line 612 of VISs. The number and the layout of the VISs are for illustration purposes and other embodiments can have a fewer or a greater number of VISs that are positioned in any given layout.

The VISs can be power VISs that are configured to transmit power signals to the devices 602 and to the devices on one or more additional die layers attached to the die layer 600. In one embodiment, the VISs positioned in the center line 612 of the grid 604 may be configured to transmit data signals between die layers in the 3D IC structure. Thus, the center line 612 is a signal trunk. In other embodiments, the data signal VISs can be positioned at other locations in a die layer. For example, the data signal VISs can be disposed at one or more of the first lines 606 that are located around the periphery of the die layer 600 (e.g., first lines 606').

As discussed earlier, non-sensitive circuits are placed in one or more unused die areas in the VIS cells (e.g., VIS cell 300 in FIG. 3) in the grid 604. The number of non-sensitive circuits in each VIS cell can be the same for each VIS cell or the number of non-sensitive circuits in at least one VIS cell may differ from the number of non-sensitive circuits in other VIS cells on the die layer 600. In one embodiment, the type of non-sensitive circuit disposed in a VIS cell is based on the type of device 602 operably connected to the non-sensitive circuit.

Figure 7:
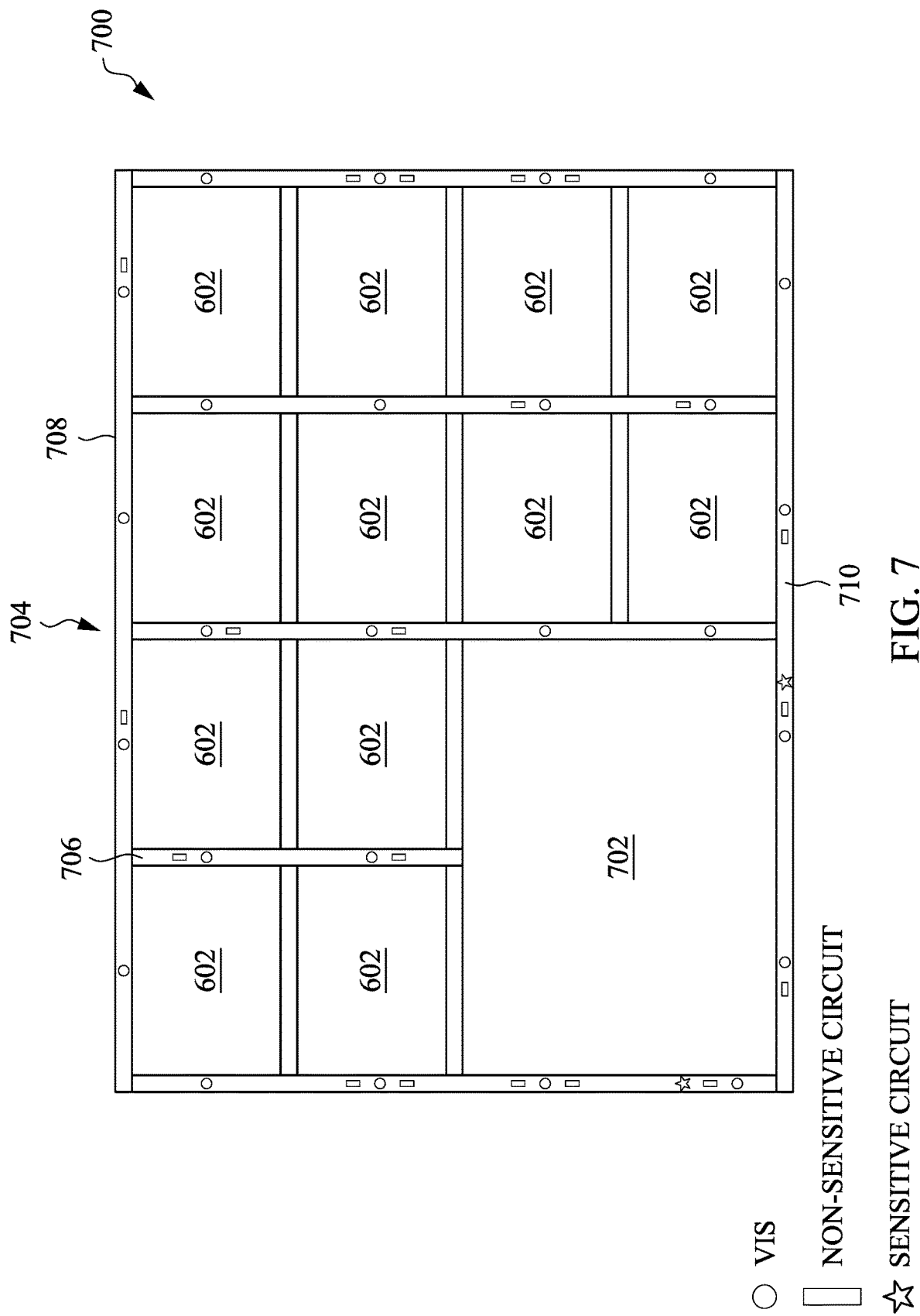
FIG. 7 illustrates a block diagram of a second example of a die layer in accordance with some embodiments.

FIG. 7 illustrates a block diagram of a second example of die layer in accordance with some embodiments. FIG. 7 shows that at least one device 702 can consume a larger amount of area on a die layer 700 compared to the other devices 602 on the die layer 700. Thus, the amounts of area of the die layer that are used by the devices 602, 702 can vary in some embodiments.

In a non-limiting example, the die layer 700 is the die layer 200A in FIG. 2. Multiple devices 602 are disposed within and/or on the die layer 700 along with the device 702. As discussed earlier, example devices 602, 702 include, but are not limited to, SRAM, RRAM, DRAM, and Flash memory devices, ADCs, I/O devices, RF circuits, analog circuits, logic circuits, sensors, and/or computing units.

In the example embodiment, a grid 704 of VISs is formed on the die layer 700 such that each device 602, 702 is laterally surrounded by one or more VISs. FIG. 7 depicts first lines 706 of VISs (e.g., vertical or perpendicular lines with respect to the edge 708) and second lines 710 of VISs (e.g., horizontal or parallel lines with respect to the edge 708). Like FIG. 6, the number and the layout of the VISs are for illustration purposes and other embodiments can have a fewer or a greater number of VISs that are positioned in any given layout.

Non-sensitive circuits are placed in one or more unused die areas of a VIS cell (e.g., VIS cell 300 in FIG. 3) in the grid 704. The number of non-sensitive circuits in each VIS cell can be the same for each VIS cell, or the number of non-sensitive circuits in at least one VIS cell may differ from the number of non-sensitive circuits in other VIS cells on the die layer 700. In one embodiment, the type of non-sensitive circuit disposed in a VIS cell is based on the type of device 602, 702 operably connected to the non-sensitive circuit.

As discussed previously, a sensitive circuit can be formed in a VIS cell. In some embodiments, a non-sensitive circuit is positioned between a VIS and the sensitive circuit to buffer the sensitive circuit from any adverse impacts associated with the proximity to the VIS.

Figure 8:
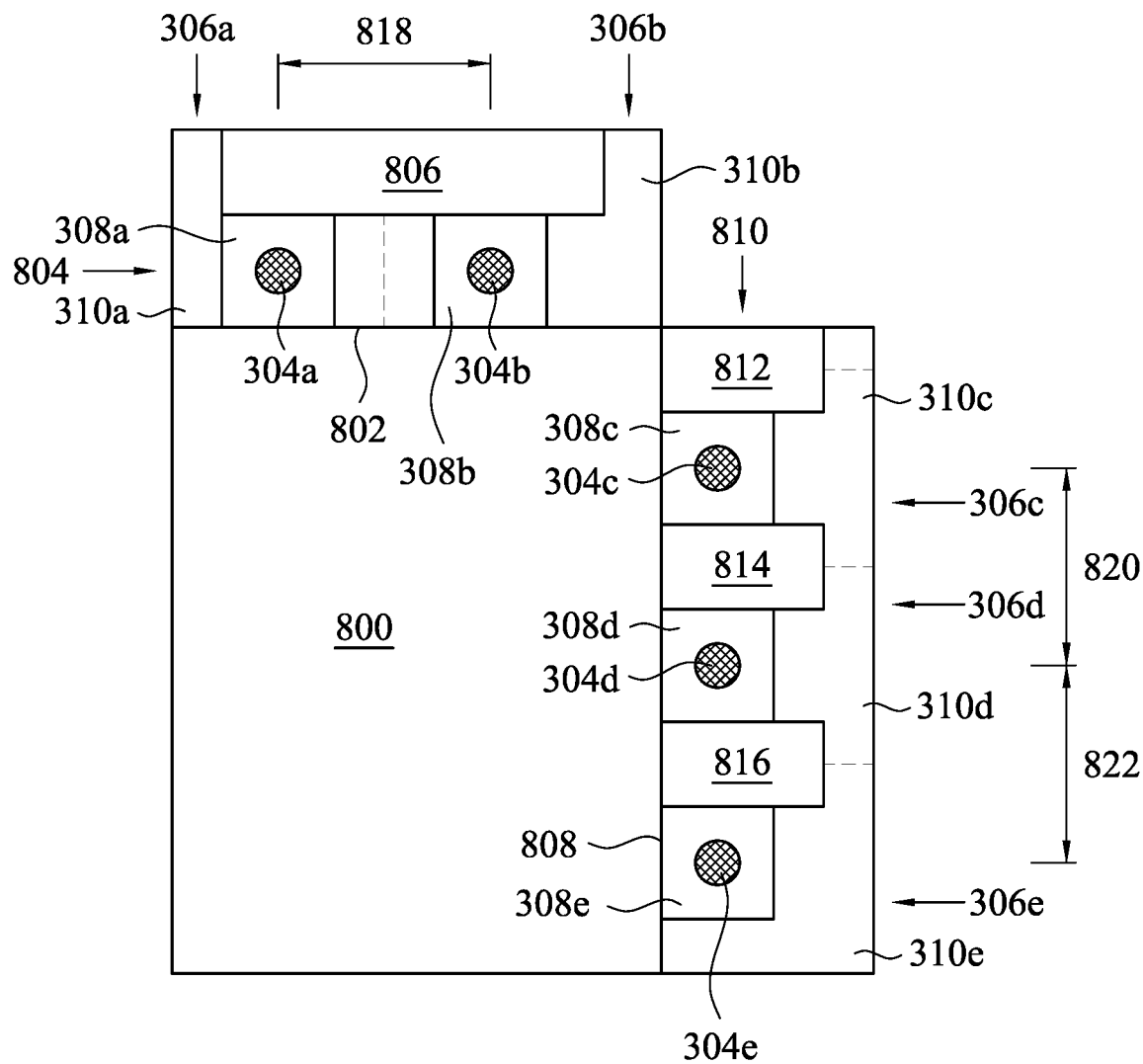
FIG. 8 depicts a first example of a layout of vertical interconnect structures in accordance with some embodiments.

FIG. 8 depicts a first example of a layout of vertical interconnect structures in accordance with some embodiments. A device 800 is formed within and/or on a die layer (e.g., die layer 502 in FIG. 5). Immediately adjacent (e.g., abutting) the side 802 of the device 800 is the second sections 310a, 310b for the VISs 304a, 304b, respectively. A single line 804 of VISs 304a, 304b (e.g., a single row of VISs 304a, 304b) is formed adjacent the device 800. In the illustrated embodiment, the first sections 308a, 308b of the unused die areas 306a, 306b are positioned around the VISs 304a, 304b. The VISs 304a, 304b are disposed in the second sections 310a, 310b of the unused die areas 306a, 306b, respectively. A non-sensitive circuit 806 is disposed within the second sections 310a, 310b associated with the VISs 304a, 304b. Thus, in some embodiments, a non-sensitive circuit 806 can be formed adjacent multiple VISs 304a, 304b of two or more unused die areas 306a, 306b.

Immediately adjacent the side 808 of the device 800 is a single line 810 of VISs 304c, 304d, 304e (e.g., a single column of VIS 304c, 304d, 304e). Non-sensitive circuits 812, 814, 816 are disposed within and/or on the second sections 310c, 310d, 310e of the unused die areas 306c, 306d, 306e. In the illustrated embodiment, the non-sensitive circuits 812, 814, 816 are positioned between the first sections 308c, 308d, 308e of the unused die areas 306c, 306d, 306e. Thus, the non-sensitive circuits 812, 814, 816 are formed in two unused die areas that abut one another (e.g., unused die areas 306c, 306d).

The pitch 818 between the VISs 304a, 304b, the pitch 820 between the VISs 304c, 304d, and the pitch 822 between the VISs 304d, 304e are the same or substantially the same distance. In one embodiment, the distance of the pitches 818, 820, 822 is defined by one or more design rules for a 3D IC. Additionally, in some embodiments, the minimum distance of the pitches 818, 820, 822 is limited by the fabrication process that is used to manufacture a die layer. Each die layer in a 3D IC can be fabricated using a particular fabrication process for that die layer. For example, when a processing unit is formed on a die layer, a more expensive fabrication process may be used to manufacture the die layer due to the high-speed requirements for the processing unit. Alternatively, when a die layer includes memory devices, analog devices, and/or a logic devices a less expensive fabrication process can be used to manufacture the die layer due to the slower speed requirements of these types of devices.

Figure 9:
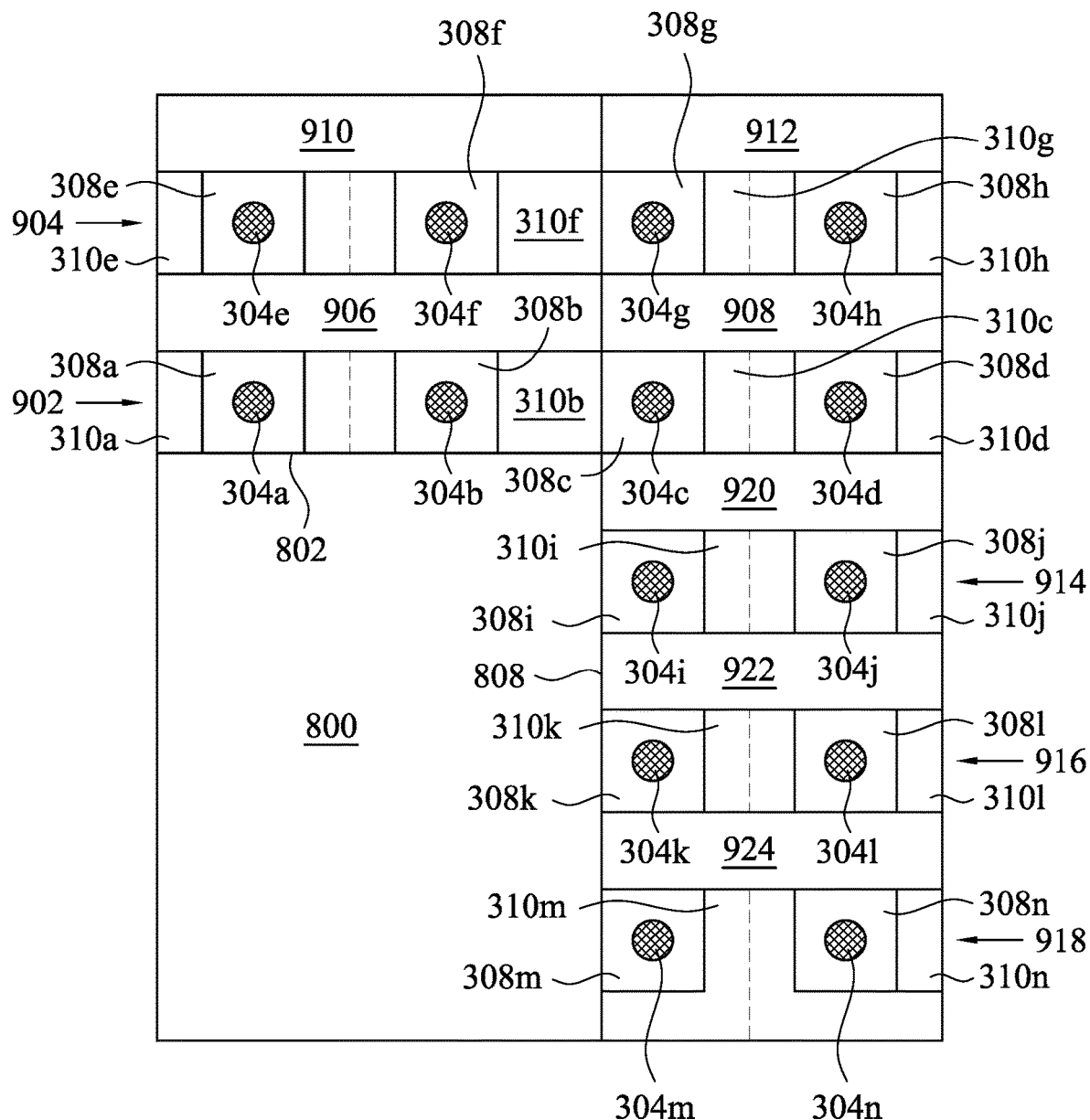
FIG. 9 illustrates a second example of a layout of vertical interconnect structures in accordance with some embodiments.

FIG. 9 depicts a second example of a layout of vertical interconnect structures in accordance with some embodiments. FIG. 9 shows that the number of lines of VISs (e.g., rows and/or columns) may be greater than one. Accordingly, the number of non-sensitive circuits in a 3D IC structure can increase, which in turn improves the utilization of the die layer.

Generally, the density of the VISs is based on one or more factors. The type of devices on a die layer, the power requirements of the devices on the die layer, the power requirements of the devices on any die layers positioned over and above of the die layer, and/or the IR drop experienced by the signals at any die layers positioned over and above the die layer are factors that are considered when determining the density of the VISs in a die layer. Additionally, the density of the VISs can vary across a die layer based on the factors. For example, the density of the VISs in one part of a die layer can differ from the density of the VISs in another part of the die layer based on the type of devices in each section of the die layer, the power requirements of the devices in each section on the die layer, the power requirements of the devices on any die layers positioned over and above of the die layer, and/or the IR drop experienced by the signals at any die layers positioned over and above the die layer.

A device 800 is formed within and/or on a die layer. Two lines 902, 904 of VISs 304a, 304b, 304c, 304d, 304e, 304f, 304g, 304h (e.g., two rows) are formed adjacent to the side 802 of the device 800. A non-sensitive circuit 906 is disposed between the VISs 304a, 304b, 304e, 304f and a non-sensitive circuit 908 is formed between the VISs 304c, 304d, 304g, 304h in the line 902. In the line 904, a non-sensitive circuit 910 is disposed adjacent the VISs 304e, 304f and a non-sensitive circuit 912 is formed between the VISs 304g, 304h.

Three additional lines 914, 916, 918 of VISs 304i, 304j, 304k, 304l, 304m, 304n are formed adjacent the side 808 of the device 800. A non-sensitive circuit 920 is disposed between the VISs 304c, 304d, 304i, 304j. A non-sensitive circuit 922 is formed between the VISs 304i, 304j, 304k, 304l. A non-sensitive circuit 924 is disposed between the VISs 304k, 304l, 304m 304n.

Like in FIG. 8, the pitch between the VISs 304a-304n is the same or substantially the same distance. The pitch can be defined by one or more design rules for a 3D IC. Additionally, in some embodiments, the minimum distance of the pitch is limited by the fabrication process that is used to manufacture the die layer that includes the VISs 304a-304n.

Figure 10:
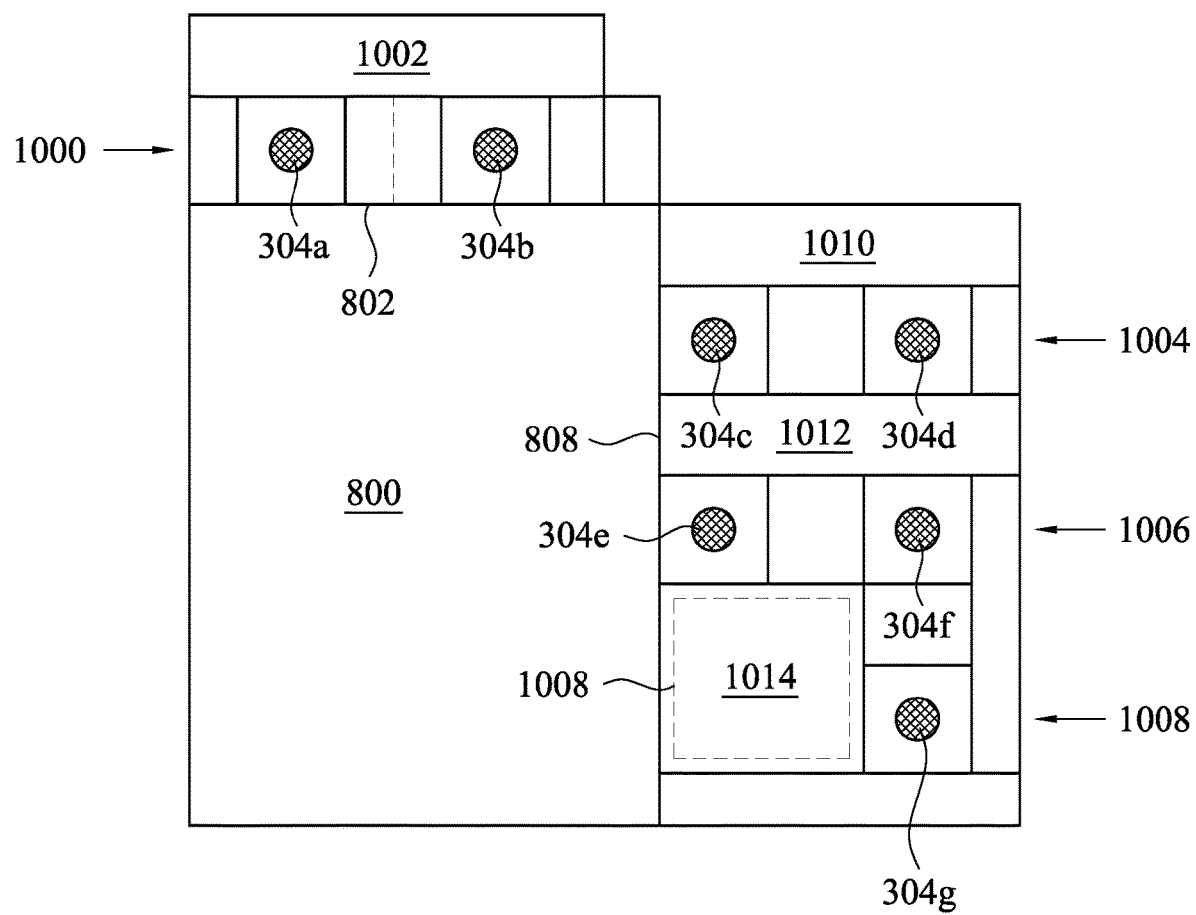
FIG. 10 illustrates a third example of a layout of vertical interconnect structures in accordance with some embodiments.

FIG. 10 depicts a third example of a layout of vertical interconnect structures in accordance with some embodiments. FIG. 10 shows that the floor plan of VISs can vary to meet improved or optimum area and/or routing requirements. For example, a VIS can be omitted to allow for a larger non-sensitive circuit, a larger sensitive circuit, and/or multiple non-sensitive and/or sensitive circuits to be formed in the VIS cell and surrounding unused die area.

A device 800 is formed within and/or on a die layer. A line 1000 of VISs 304a, 304b is formed adjacent to the side 802 of the device 800. A non-sensitive circuit 1002 is disposed adjacent to the VISs 304a, 304b.

Three additional lines 1004, 1006, 1008 of VISs 304c, 304d, 304e, 304f, 304g are formed adjacent the side 808 of the device 800. A non-sensitive circuit 1010 is disposed adjacent to the VISs 304c, 304d. A non-sensitive circuit 1012 is disposed between the VISs 304c, 304d, 304e, 304f. A non-sensitive circuit 1014 is formed adjacent to the VISs 304e, 304f, 304g.

In the illustrated embodiment, a VIS is omitted from the die area that includes the non-sensitive circuit 1014, which enables a larger non-sensitive circuit 1014 to be formed and/or allows the die area to include multiple non-sensitive circuits. In one embodiment, the larger area associated with the non-sensitive circuit 1014 is used to improve or optimize the routing of signal lines (e.g., to the device 800 and/or to and from the VISs 304a-304g).

Figure 11:
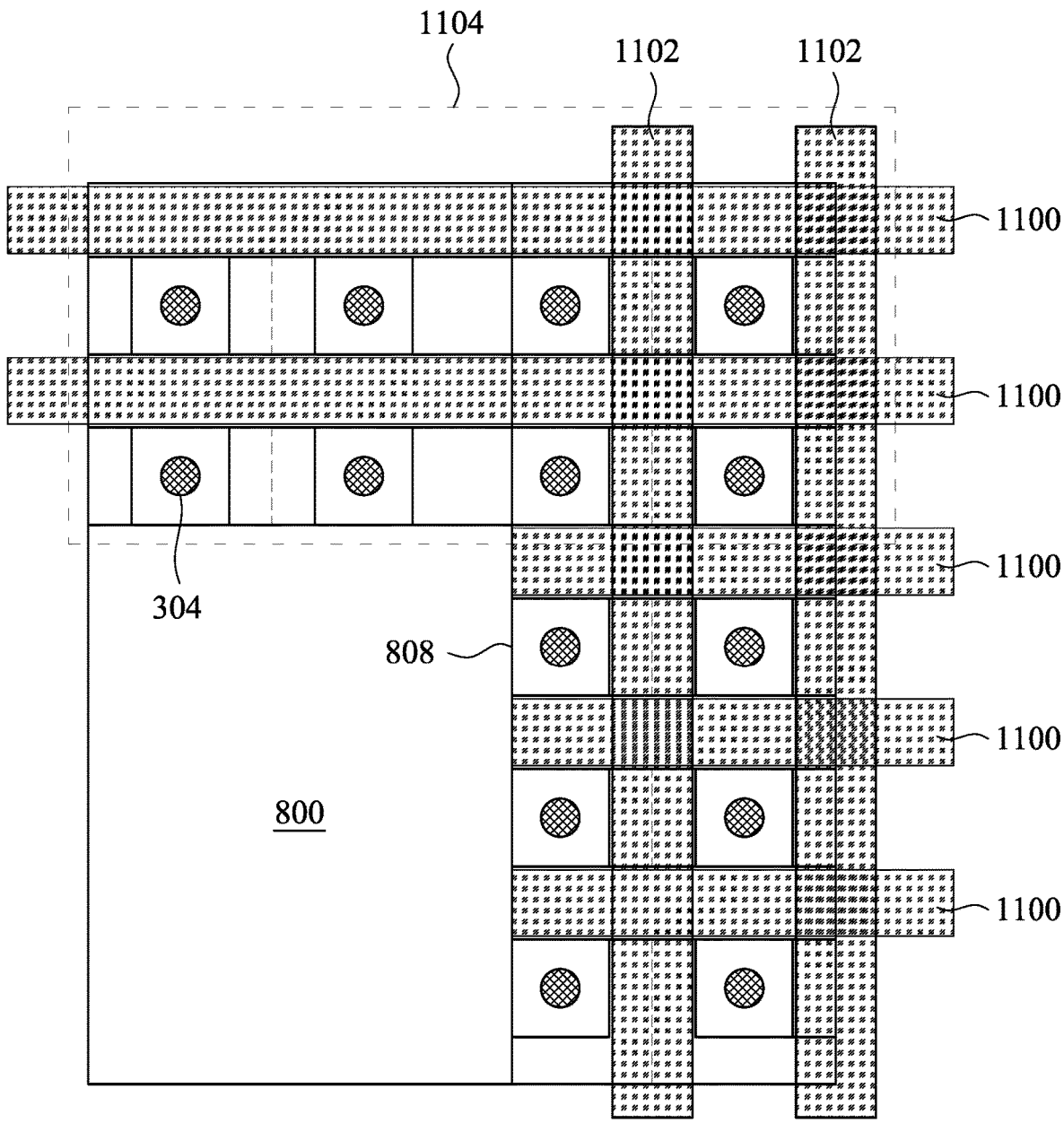
FIG. 11 illustrates a fourth example of a layout of vertical interconnect structures in accordance with some embodiments.
Figure 12:
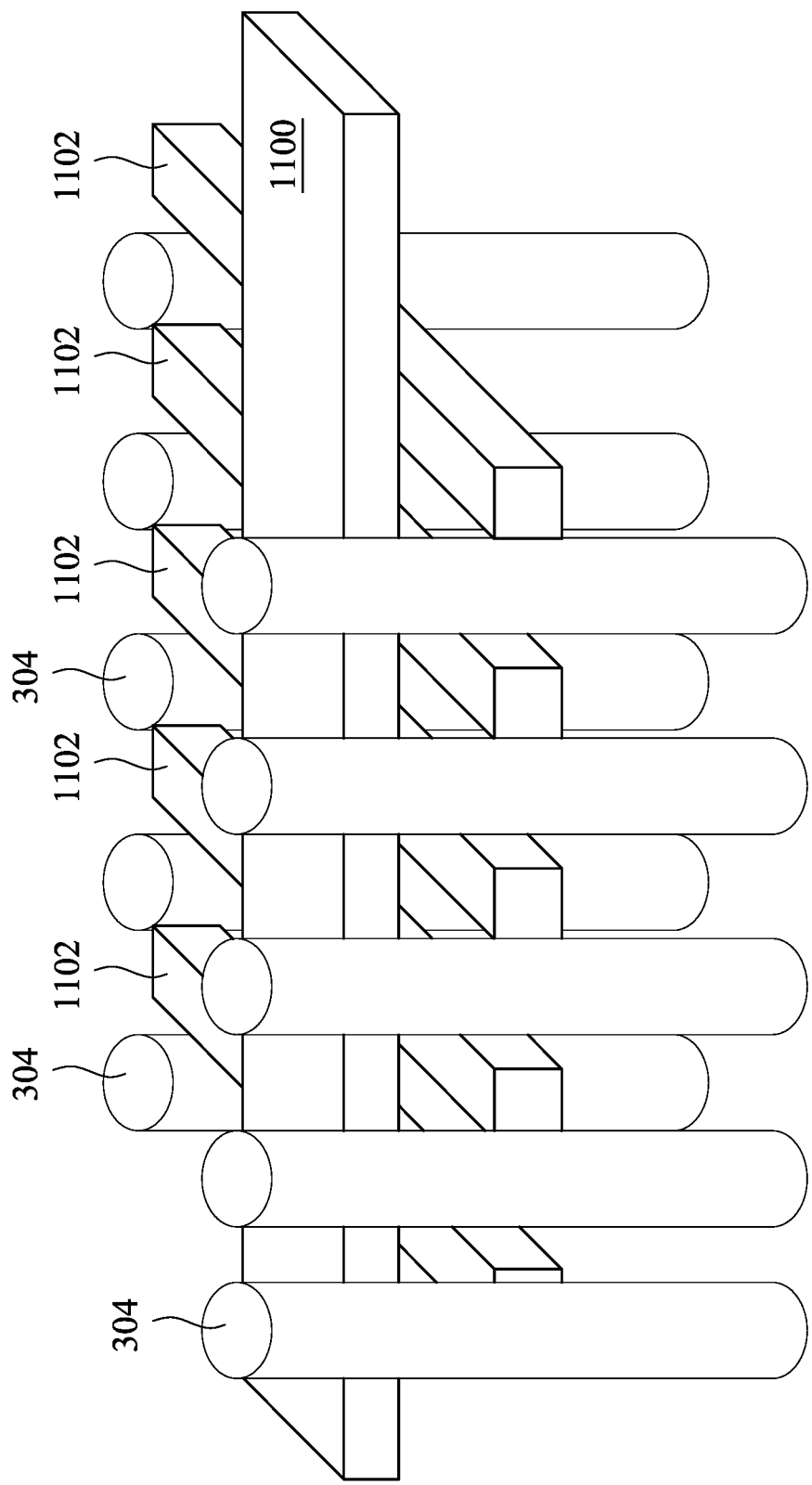
FIG. 12 illustrates the vertical interconnect structures and the signal lines shown in FIG. 11 in accordance with some embodiments.

FIG. 11 depicts a fourth example of a layout of vertical interconnect structures in accordance with some embodiments. FIG. 11 is described in conjunction with FIG. 12, where FIG. 12 illustrates the VISs and the signal lines shown in FIG. 11 in accordance with some embodiments. As shown in FIG. 11, signal lines 1100, 1102 are disposed between the VISs 304 to increase or optimize signal routing within the die layer 1104. The signal line 1100, 1102 are used to route signals between the devices, the sensitive circuits, and the non-sensitive circuits that are disposed on the die layer 1104.

In the illustrated embodiment, the signal lines 1100 are positioned perpendicular to the side 808 of the device 800, while the signal lines 1102 are positioned parallel to the side 808. The number and the dimensions of the signal lines 1100, 1102 are based on the pitch of the VISs 304, the type, the number, and the locations of the devices 800 on the die layer 1104, the type, the number, and the locations of the non-sensitive and sensitive circuits on the die layer 1104, and/or the routing requirements of the die layer 1104.

In FIGS. 11 and 12, signal lines 1100, 1102 are positioned between the VISs 304. Embodiments can include any suitable number of signal lines 1100, 1102. In some embodiments, one or more signal lines 1100, 1102 are disposed over the device 800 as well as over one or more other devices on the die layer 1104.

Figure 13:
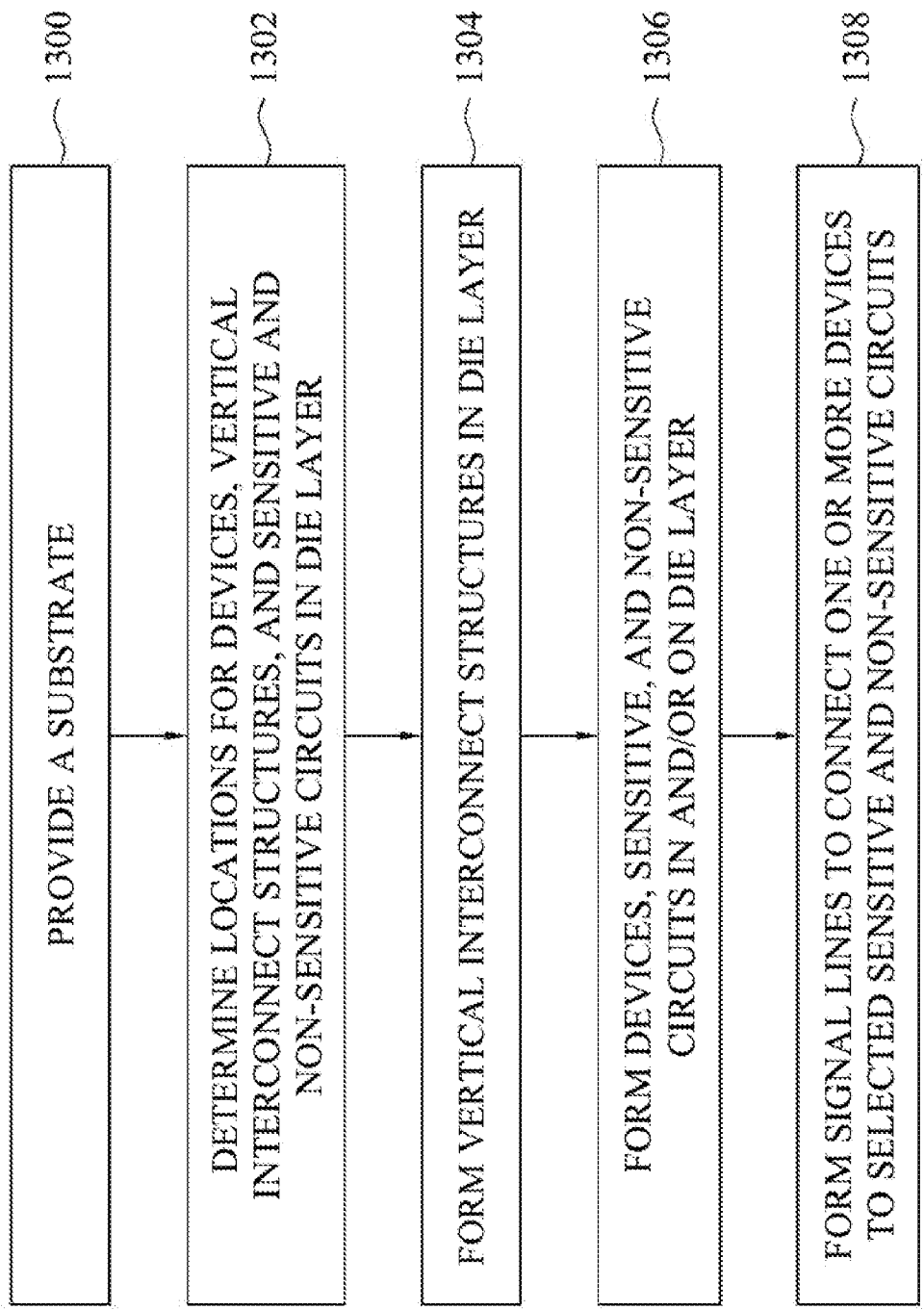
FIG. 13 illustrates a flowchart of an example method of fabricating a die layer in accordance with some embodiments.

FIG. 13 depicts a flowchart of an example method of fabricating a die layer in accordance with some embodiments. Initially, as shown in block 1300, a substrate is provided. The substrate can be any suitable type of substrate. Example substrates include, but are not limited to, a silicon substrate, a silicon on insulator (SOI) substrate, a Sapphire substrate, or a compound substrate (e.g., a gallium arsenide substrate, a gallium nitride substrate).

Next, as shown in block 1302, the locations for the devices, the VISs, the non-sensitive circuits, and any sensitive circuits are determined. Typically, the locations for the devices, the VISs, the non-sensitive circuits, and any sensitive circuits are determined based on a device specification and a layout diagram. In one embodiment, the locations are determined using an EDA. In other embodiments, the some or all of the locations are established manually.

The VISs are formed at block 1304. The VIS can be TSVs, TDVs, and other types of vertical interconnect structures. Any suitable process can be used to construct the VISs. For example, one technique for forming TSVs includes forming a first mask layer over the substrate and patterning the first mask layer to include openings where the VISs will be formed.

A conductive material is formed (e.g., deposited) in the openings. In a non-limiting example, the conductive material is deposited using a process or a CVD process. The conductive material can be made of any suitable conductive material; such as copper, cobalt, aluminum, tungsten, doped polysilicon, other suitable conductive material and/or combinations thereof.

The first mask layer is then removed, and a second mask layer is formed over the substrate. The second mask layer is patterned to include openings where insulating material will be formed around the conductive material. An insulating material is formed in the openings around the conductive material to electrically isolate the TSVs. The second mask layer is then removed.

The devices are formed within and/or on the substrate and the non-sensitive and any sensitive circuits are fabricated within and/or on the unused die areas of the VISs (block 1306). Any suitable process can be used to construct the devices, the non-sensitive circuits, and the sensitive circuits. One or more signal lines are formed at block 1308 to connect a device or devices to a selected sensitive circuit and/or a selected non-sensitive circuit on the die layer. The signal line(s) electrically connect a device to a respective sensitive and/or a respective non-sensitive circuit.

Figure 14:
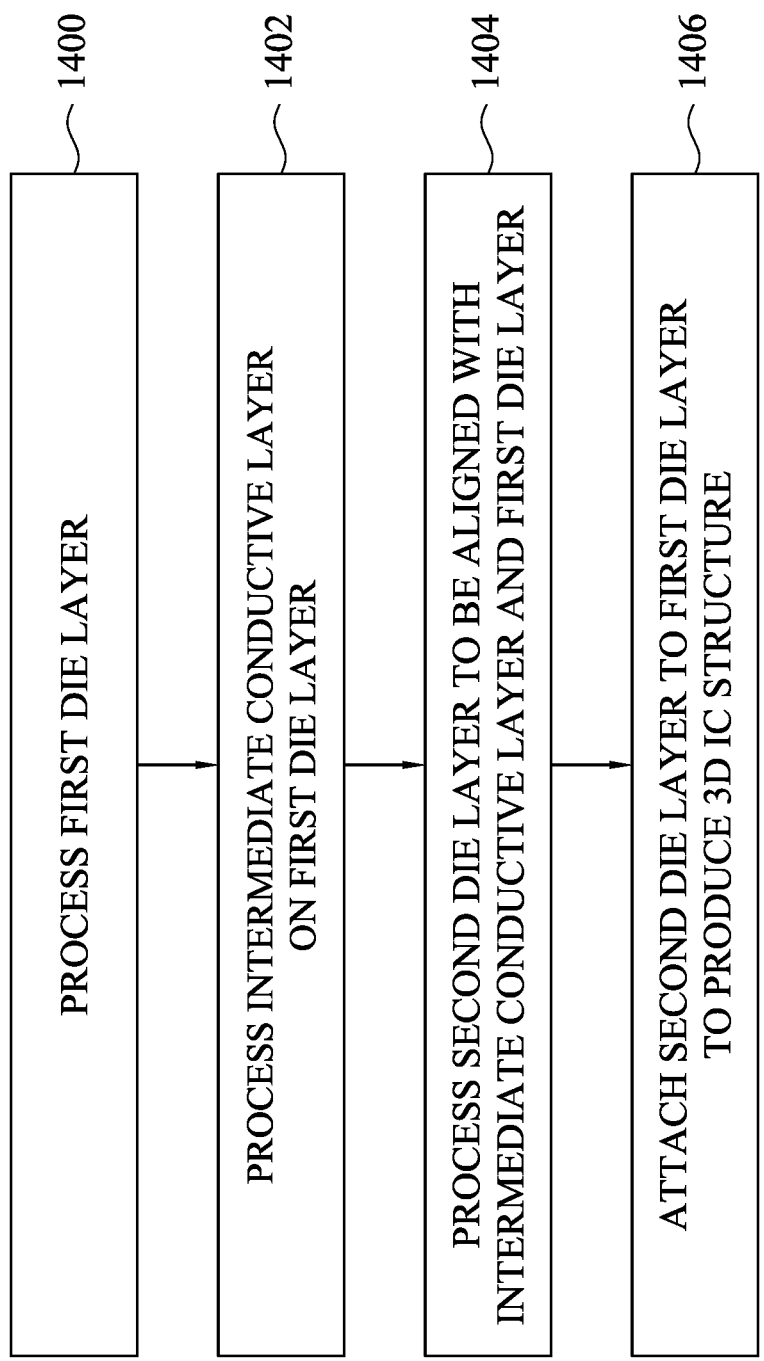
FIG. 14 illustrates a flowchart of an example method of fabricating a 3D IC structure in accordance with some embodiments.

FIG. 14 illustrates a flowchart of an example method of fabricating a 3D IC structure in accordance with some embodiments. Initially, as shown in block 1400, a first die layer is processed. The processing of the first die layer includes forming the devices, the VISs, and the sensitive and non-sensitive circuits within and/or on the first die layer. Any suitable fabrication process can be used to construct the devices, the VISs, and the non-sensitive and sensitive circuits.

An intermediate conductive layer is formed on a surface of the first die layer and patterned to produce one or more contacts and/or one or more signal lines (block 1402). In an example process, a conductive material (e.g., copper) is deposited on the surface of the first die layer. A mask layer is formed over the conductive material and patterned to define the locations of the contact(s) and/or signal line(s). The conductive material exposed in the patterned mask layer is removed (etched) to produce the one or more contacts and/or the one or more signal lines. An insulating material is then formed between the contact(s) and/or the signal line(s). As described earlier, the intermediate conductive layer is used to route signals between the first die layer and a second die layer positioned over the first die layer.

A second die layer is processed at block 1404. Similar to the processing of the first die layer, the processing of the second die layer includes forming the devices, the VISs, and the non-sensitive and sensitive circuits within and/or on the second die layer. The second die layer is processed to align with the first die layer. Next, as shown in block 1406, the second die layer is attached to the intermediate conductive layer and the first die layer to produce a 3D IC structure.

In other embodiments, the operations noted in the blocks may occur out of the order as shown in FIGS. 13 and 14. For example, two blocks shown in succession may in fact be executed substantially concurrently. Additionally or alternatively, blocks may be executed in the reverse order, depending upon the functionality/acts involved.

Figure 15:
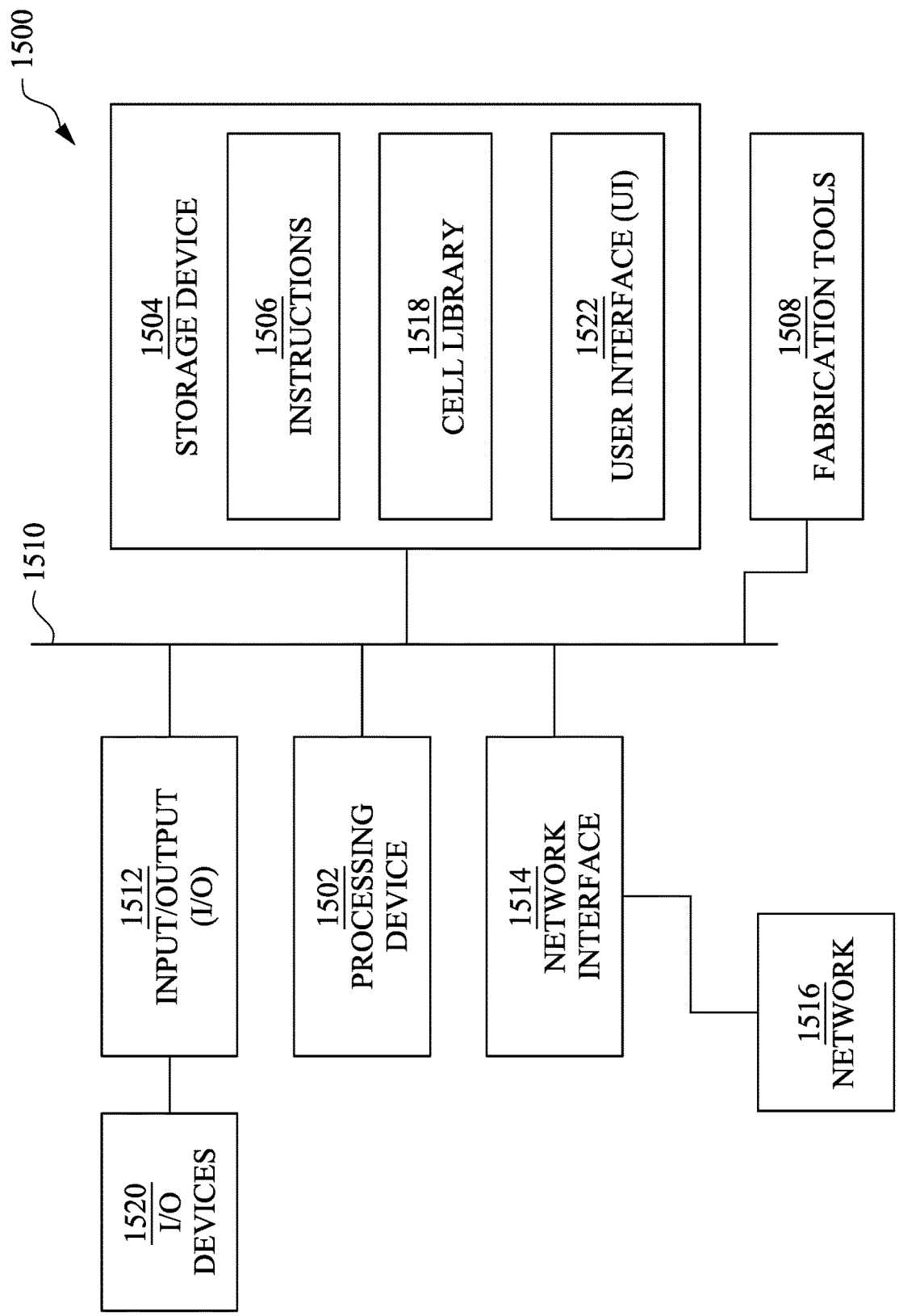
FIG. 15 illustrates an example system that is suitable for designing a 3D IC structure in accordance with some embodiments.

FIG. 15 depicts an example system that is suitable for designing a 3D IC structure in accordance with some embodiments. The design process may be implemented by a computer system, such as an ECAD system. Some or all of the operations for design (e.g., layout) methods disclosed herein are capable of being performed as part of a design procedure performed in a design house, such as the design house 1602 discussed below in conjunction with FIG. 16.

In some embodiments, the system 1500 includes an automated place and route (APR) system. In some embodiments, the system 1500 includes a processing device 1502 and a non-transitory, computer-readable storage medium 1504 ("storage device"). The processing device 1502 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1504 may be encoded with or store, for example, computer program code (e.g., a set of executable instructions 1506). Execution of the executable instructions 1506 by the processing device 1502 represents (at least in part) an ECAD tool that implements a portion or all of, the methods described herein to produce the designs for the structures and the ICs disclosed herein. Further, the fabrication tools 1508 may be included for layout and physical implementation of the ICs. In one or more embodiments, the storage device 1504 is an electronic, magnetic, optical, electromagnetic, infrared, and/or a semiconductor system (or apparatus or device). For example, the storage device 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 1504 includes a compact disk-read only memory (CD-ROM), a compact disk-read/write (CD-R/W), and/or a digital video disc (DVD).

The processing device 1502 is operably connected to the storage device 1504 via a bus 1510. The processing device 1502 is also operably connected to an input/output (I/O) interface 1512 and a network interface 1514 by the bus 1510. The network interface 1514 is operably connected to a network 1516 so that the processing device 1502 and the storage device 1504 are capable of connecting to external elements via the network 1516. In one or more embodiments, the network 1516 is illustrative of any type of wired and/or wireless network, such as an intranet and/or a distributed computing network (e.g., the Internet).

The network interface 1514 allows the system 1500 to communicate with other computing or electronic devices (not shown) via the network 1516. The network interface 1514 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 1516.

The processing device 1502 is configured to execute the executable instructions 1506 encoded in the storage device 1504 to cause the system 1500 to be usable for performing some or all of the processes and/or methods. For example, an electronic design application (e.g., in an ECAD system or as a standalone application) can be configured to perform the methods and techniques shown in FIGS. 1-14.

In one or more embodiments, the storage device 1504 stores the executable instructions 1506 configured to cause the system 1500 to be usable for performing some or all of the processes and/or methods. In one or more embodiments, the storage device 1504 also stores information that facilitates execution of a portion of or all of the processes and/or methods. In one or more embodiments, the storage device 1504 stores a cell library 1518 that includes (at least in part) standard and/or previously designed cells.

The I/O interface 1512 is operably connected to I/O devices 1520. In one or more embodiments, the I/O devices 1520 include one or more of an image capture device, a microphone, a scanner, a keyboard, a keypad, a mouse, a trackpad, a touchscreen, and/or cursor direction keys for communicating information and commands to the processing device 1502. The I/O devices 1520 may also include one or more displays, one or more speakers, a printer, headphones, a haptic or tactile feedback device, and the like.

The system 1500 is configured to receive information through the I/O interface 1512. The information received through the I/O interface 1512 includes one or more of instructions, data, design rules, cell libraries, and/or other parameters for processing by the processing device 1502. The information is transferred to the processing device 1502 via the bus 1510. The system 1500 is configured to receive information related to a user interface (UI) through the I/O interface 1512. The information is stored in the storage device 1504 as a UI 1522 or for presentation in the UI 1522.

In some embodiments, a portion or all of the processes and/or methods is implemented as a standalone software application (e.g., an EDA) for execution by a processing device (e.g., processing device 1502). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1500. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1504). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1500 may include the fabrication tools 1508 for implementing the processes and/or methods stored in the storage device 1504. For instance, a synthesis may be performed on a design in which the behavior and/or functions desired from the design are transformed to a functionally equivalent logic gate-level circuit description by matching the design to cells selected from the cell library 1518. The synthesis results in a functionally equivalent logic gate-level circuit description, such as a gate-level netlist. Based on the gate-level netlist, a photolithographic mask may be generated that is used to fabricate the IC by the fabrication tools 1508. Further aspects of device fabrication are disclosed in conjunction with FIG. 16, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 1600.

Figure 16:
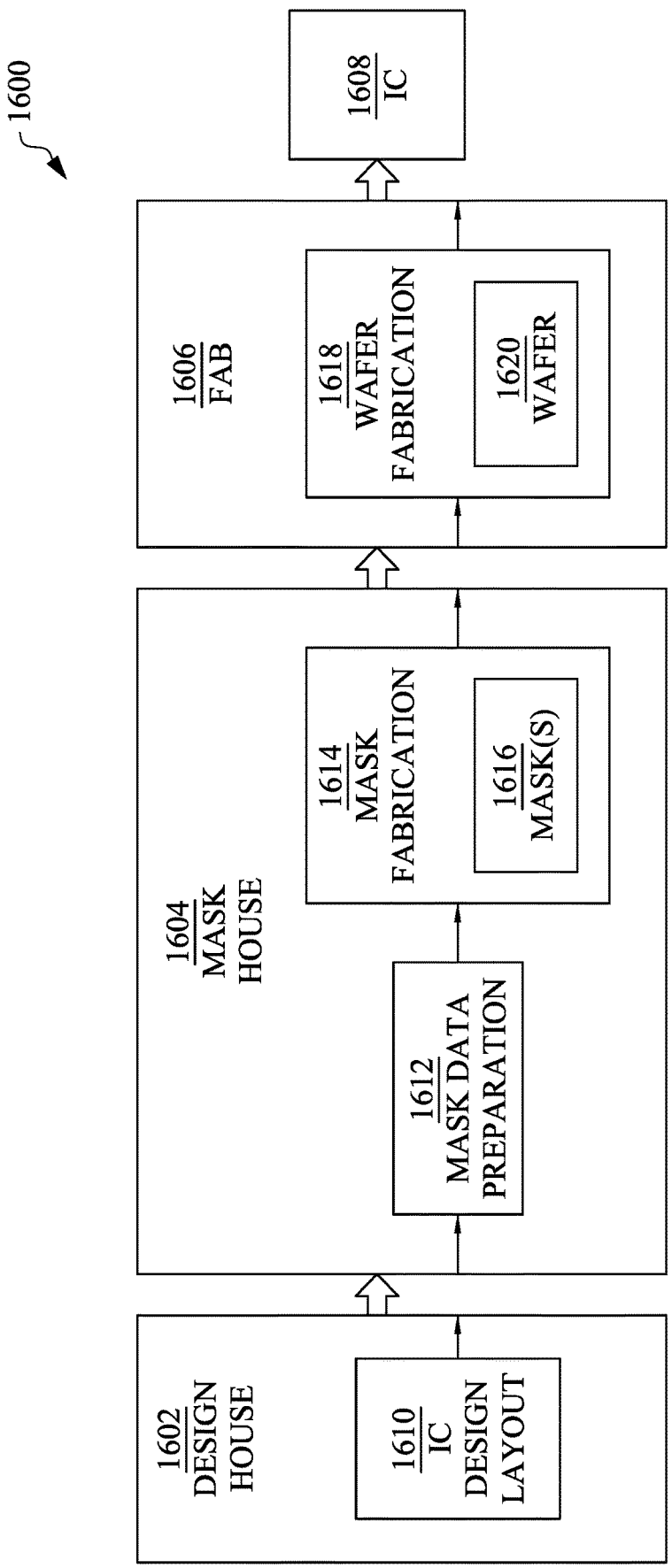
FIG. 16 illustrates a block diagram of an example integrated circuit manufacturing system and manufacturing flow in accordance with some embodiments.

FIG. 16 illustrates a block diagram of an example integrated circuit manufacturing system and manufacturing flow in accordance with some embodiments. In the illustrated embodiment, the IC manufacturing system 1600 includes entities, such as a design house 1602, a mask house 1604, and an IC manufacturer/fabricator ("fab") 1606, that interact with one another in the design, development, and manufacturing cycles and/or services related to manufacturing an IC 1608, such as the ICs disclosed herein. The entities in the system 1600 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 1602, the mask house 1604, and the IC fab 1606 is owned by a single company. In some embodiments, two or more of the design house 1602, the mask house 1604, and the IC fab 1606 coexist in a common facility and use common resources.

The design house (or design team) 1602 generates an IC design layout diagram 1610. The IC design layout diagram 1610 includes various geometrical patterns, or IC layout diagrams designed for the IC 1608 to be fabricated. The geometrical patterns correspond to patterns of metal, oxide, or semiconductor layers that make up the various components of the IC 1608 to be fabricated. The various layers combine to form various IC features. For example, a portion of the IC design layout diagram 1610 includes various IC features, such as active diffusion regions, gate electrodes, source and drain, metal lines or local vias, and openings for bonding pads, to be formed in a semiconductor substrate (such as a silicon wafer) and various material layers disposed on the semiconductor substrate.

The design house 1602 implements a design procedure to form the IC design layout diagram 1610. The design procedure includes one or more of logic design, physical design or place and route. The IC design layout diagram 1610 is presented in one or more data files having information of the geometrical patterns. For example, the IC design layout diagram 1610 can be expressed in a GDS file format, a GDSII file format, or a DFII file format.

The mask house 1604 includes mask data preparation 1612 and mask fabrication 1614. The mask house 1604 uses the IC design layout diagram 1610 to manufacture one or more masks 1616 to be used for fabricating the various layers of the IC 1608 according to the IC design layout diagram 1610. The mask house 1604 performs mask data preparation 1612, where the IC design layout diagram 1610 is translated into a representative data file ("RDF"). The mask data preparation 1612 provides the RDF to the mask fabrication 1614. The mask fabrication 1614 includes a mask writer (not shown) that converts the RDF to an image on a substrate, such as a mask (reticle) 1616 on a semiconductor wafer. The IC design layout diagram 1610 is manipulated by the mask data preparation 1612 to comply with particular characteristics of the mask writer and/or requirements of the IC fab 1606. In FIG. 16, the mask data preparation 1612 and the mask fabrication 1614 are illustrated as separate elements. In some embodiments, the mask data preparation 1612 and the mask fabrication 1614 can be collectively referred to as a mask data preparation.

In some embodiments, the mask data preparation 1612 includes an optical proximity correction (OPC) that uses lithography enhancement techniques to compensate for image errors, such as those that can arise from diffraction, interference, other process effects and the like. The OPC adjusts the IC design layout diagram 1610. In some embodiments, the mask data preparation 1612 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1612 includes a mask rule checker (MRC) (not shown) that checks the IC design layout diagram 1610 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 1610 to compensate for limitations during the mask fabrication, which may undo part of the modifications performed by OPC in order to meet mask creation rules.

In some embodiments, the mask data preparation 1612 includes lithography process checking (LPC) (not shown) that simulates processing that will be implemented by the IC fab 1606 to fabricate the IC 1608. LPC simulates this processing based on the IC design layout diagram 1610 to create a simulated manufactured device, such as the IC 1608. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 1610.

It should be understood that the above description of the mask data preparation 1612 has been simplified for the purposes of clarity. In some embodiments, the mask data preparation 1612 includes additional features such as a logic operation (LOP) to modify the IC design layout diagram 1610 according to manufacturing rules. Additionally, the processes applied to the IC design layout diagram 1610 during the mask data preparation 1612 may be executed in a variety of different orders.

After the mask data preparation 1612 and during the mask fabrication 1614, a mask 1616 or a group of masks 1616 are fabricated based on the IC design layout diagram 1610. In some embodiments, the mask fabrication 1614 includes performing one or more lithographic exposures based on the IC design layout diagram 1610. In some embodiments, an electron-beam (e-beam) or a mechanism of multiple e-beams is used to form a pattern on a mask(s) 1616 (photomask or reticle) based on the IC design layout diagram 1610. The mask(s) 1616 can be formed in various technologies. For example, in some embodiments, the mask (s) 1616 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 1616 includes a transparent substrate (e.g., fused quartz) and an opaque material (e.g., chromium) coated in the opaque regions of the binary mask.

In another example, the mask(s) 1616 is formed using a phase shift technology. In a phase shift mask (PSM) version of the mask(s) 1616, various features in the pattern formed on the phase shift mask are configured to have a proper phase difference to enhance the resolution and imaging quality. In various examples, the phase shift mask can be attenuated PSM or alternating PSM. The mask(s) 1616 generated by the mask fabrication 1614 is used in a variety of processes. For example, a mask(s) 1616 is used in an ion implantation process to form various doped regions in the semiconductor wafer, in an etching process to form various etching regions in the semiconductor wafer, and/or in other suitable processes.

The IC fab 1606 includes wafer fabrication 1618. The IC fab 1606 is an IC fabrication business that includes one or more manufacturing facilities for the fabrication of a variety of different IC products. In some embodiments, the IC fab 1606 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1606 uses the mask(s) 1616 fabricated by the mask house 1604 to fabricate the IC 1608. Thus, the IC fab 1606 at least indirectly uses the IC design layout diagram 1610 to fabricate the IC 1608. In some embodiments, a semiconductor wafer 1620 is fabricated by the IC fab 1606 using the mask(s) 1616 to form the IC 1608. In some embodiments, the IC fab 1606 includes performing one or more lithographic exposures based at least indirectly on the IC design layout diagram 1610. The semiconductor wafer 1620 includes a silicon substrate or other proper substrate having material layers formed thereon. The semiconductor wafer 1620 further includes one or more of various doped regions, dielectric features, multilevel interconnects, and the like (formed at subsequent manufacturing steps).

In one aspect, a 3D integrated circuit structure includes a first die and a second die disposed over the first die. The second die includes a device and a vertical interconnect structure (VIS) cell disposed adjacent to the device. A non-sensitive circuit is disposed in the VIS cell.

In another aspect, a 3D integrated circuit structure includes a first die layer and a second die layer disposed over the first die layer. The first die layer includes a first device and a first vertical interconnect structure (VIS) cell adjacent to the first device. A first VIS is disposed in the first VIS cell, and a first non-sensitive circuit is disposed in the first VIS cell. The second die layer includes a second device and a second VIS cell adjacent the second device. A second VIS is disposed in the second VIS cell, and a second non-sensitive circuit is disposed in the second VIS cell.

In yet another aspect, a method of fabricating a die layer includes forming a vertical interconnect structure (VIS) in a VIS cell in the die layer. A device is formed in the die layer adjacent to the VIS cell. A non-sensitive circuit is formed in the VIS cell. A signal line that connects to the non-sensitive circuit and to the device is formed to electrically connect the non-sensitive circuit to the device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A 3D integrated circuit structure, comprising:
   a first die layer; and
   a second die layer disposed over the first die layer, the second die layer comprising:
   a device;
   a vertical interconnect structure (VIS) cell disposed adjacent to the device; and
   a non-sensitive circuit disposed in the VIS cell,
   wherein the device is a first device, the first die layer includes a second device, and the second device is a different type of device from a type of device of the first device to produce a heterogeneous 3D integrated circuit structure.

2. The 3D integrated circuit structure of claim 1, wherein the VIS cell abuts the device.

3. The 3D integrated circuit structure of claim 1, wherein the device comprises one of a memory device, a logic circuit, an input/output device, a sensor, an RF circuit, an analog circuit, an analog-to-digital converter, or a computing device.

4. The 3D integrated circuit structure of claim 1, wherein the non-sensitive circuit comprises one of a resistor, an inductor, a capacitor, a transformer, a diode, or a repeater.

5. The 3D integrated circuit structure of claim 1, further comprising a VIS formed in the VIS cell, wherein the VIS is configured to transmit a power signal.

6. The 3D integrated circuit structure of claim 1, wherein:
the VIS cell is a first VIS cell;
the non-sensitive circuit is a first non-sensitive circuit; and
the second die layer further comprises a second VIS cell and a second non-sensitive circuit formed in the second VIS cell.

7. The 3D integrated circuit structure of claim 1, wherein:
the VIS cell is a first VIS cell; and
the first die layer further comprises a second VIS cell that includes a VIS.

8. A 3D integrated circuit structure, comprising:
a first die layer, comprising:
a first device;
a first vertical interconnect structure (VIS) cell adjacent to the first device;
a first VIS disposed in the first VIS cell; and
a first non-sensitive circuit disposed in the first VIS cell; and
a second die layer disposed over the first die layer and comprising:
a second device;
a second VIS cell adjacent the second device;
a second VIS disposed in the second VIS cell; and
a second non-sensitive circuit disposed in the second VIS cell.

9. The 3D integrated circuit structure of claim 8, wherein:
the first VIS is electrically connected to the second VIS; and
the first and the second VISs are configured to transmit a power signal.

10. The 3D integrated circuit structure of claim 9, further comprising an intermediate conductive layer, wherein the first VIS is electrically connected to the second VIS using a contact or a signal line in the intermediate conductive layer.

11. The 3D integrated circuit structure of claim 8, wherein:
the first VIS is electrically connected to the second VIS; and
the first and the second VISs are configured to transmit a data signal.

12. The 3D integrated circuit structure of claim 11, further comprising an intermediate conductive layer, wherein the first VIS is electrically connected to the second VIS using a contact or a signal line in the intermediate conductive layer.

13. The 3D integrated circuit structure of claim 8, wherein:
the first die layer further includes a third VIS; and
the 3D integrated circuit structure further comprises a signal line positioned between the first and the third VISs to route a signal from the first device to a third device on the first die layer.

14. The 3D integrated circuit structure of claim 8, wherein:
the first device and the second device each comprises one of a memory device, a logic circuit, an input/output device, a sensor, an RF circuit, an analog circuit, an analog-to-digital converter, or a computing device; and
the first non-sensitive circuit and the second non-sensitive circuit each comprises one of a resistor, an inductor, a capacitor, a transformer, a diode, or a repeater.

15. The 3D integrated circuit structure of claim 8, further comprising a sensitive circuit disposed in the first VIS cell, wherein the first non-sensitive circuit is positioned between the sensitive circuit and the first VIS.

16. The 3D integrated circuit structure of claim 8, wherein the second device and the first device are the same type of device to produce a homogeneous 3D integrated circuit structure.

17. The 3D integrated circuit structure of claim 8, wherein:
the first die layer further comprises a third VIS cell adjacent the first VIS cell;
the second die layer further comprises a fourth VIS cell adjacent the second VIS cell; and
a pitch between the first and the third VIS cells differs from a pitch between the second and the fourth VIS cells.

18. A 3D integrated circuit structure, comprising:
a first die layer includes a first vertical interconnect structure (VIS) cell that includes a first VIS; and
a second die layer disposed over the first die layer, the second die layer comprising:
a device;
a second VIS cell that includes a second VIS, the second VIS cell disposed adjacent to the device; and
a non-sensitive circuit disposed in the second VIS cell,
wherein the device is a first device, the first die layer includes a second device, and the second device is a different type of device from a type of device of the first device to produce a heterogeneous 3D integrated circuit structure.

19. The 3D integrated circuit structure of claim 18, wherein:
the first VIS is electrically connected to the second VIS; and
the first and the second VISs are configured to transmit a power signal.

20. The 3D integrated circuit structure of claim 18, wherein:
the first VIS is electrically connected to the second VIS; and
the first and the second VISs are configured to transmit a data signal.

* * * * *